(12) United States Patent
Neves et al.

(10) Patent No.: US 7,047,506 B2
(45) Date of Patent: May 16, 2006

(54) METHOD TO IDENTIFY GEOMETRICALLY NON-OVERLAPPING OPTIMIZATION PARTITIONS FOR PARALLEL TIMING CLOSURE

(75) Inventors: Jose Luis Pontes Correia Neves, Poughkeepsie, NY (US); Jiyoun Kim, Ann Arbor, MI (US)

(73) Assignee: International Business Machines Corporation, Armonk, NY (US)

( * ) Notice: Subject to any disclaimer, the term of this patent is extended or adjusted under 35 U.S.C. 154(b) by 187 days.

(21) Appl. No.: 10/716,772

(22) Filed: Nov. 19, 2003

(65) Prior Publication Data

US 2005/0108665 A1 May 19, 2005

(51) Int. Cl.
*G06F 17/50* (2006.01)
(52) U.S. Cl. .................................. 716/2; 716/7; 716/10
(58) Field of Classification Search ............... 716/1–18
See application file for complete search history.

(56) References Cited

U.S. PATENT DOCUMENTS

| 5,218,551 | A  | * | 6/1993 | Agrawal et al. ............... 716/10 |
| 6,415,426 | B1 | * | 7/2002 | Chang et al. .................. 716/10 |
| 6,446,239 | B1 | * | 9/2002 | Markosian et al. ............. 716/2 |
| 6,449,761 | B1 | * | 9/2002 | Greidinger et al. ........... 716/11 |

OTHER PUBLICATIONS

"Multi-objective circuit partitioning for cutsize and path-based delay minimization", Ababei et al., 2002 IEEE, pp. 181-185.

* cited by examiner

Primary Examiner—Vuthe Siek
Assistant Examiner—Nghia M. Doan
(74) Attorney, Agent, or Firm—Jay H. Anderson

(57) ABSTRACT

A method is provided to speed up timing optimization after placement by parallelizing the optimization step. The method includes performing multiple partitions in the set of timing critical paths such that each partition can be optimized independently in a separate processor. To eliminate the need for inter-processor communication, conditions of timing independence and physical independence are imposed on each partition, thereby defining sub-sets of endpoints and paths associated therewith. The optimizing is performed in parallel by the processors, each of the processors optimizing timing of the paths associated with the endpoints in respective sub-sets. In a preferred embodiment, an endpoint graph is constructed from the list of critical paths, where the endpoint graph has at least one vertex representing critical paths associated with a given endpoint. The partitioning step then includes the step of partitioning the endpoint graph to define sub-sets of vertices.

21 Claims, 12 Drawing Sheets

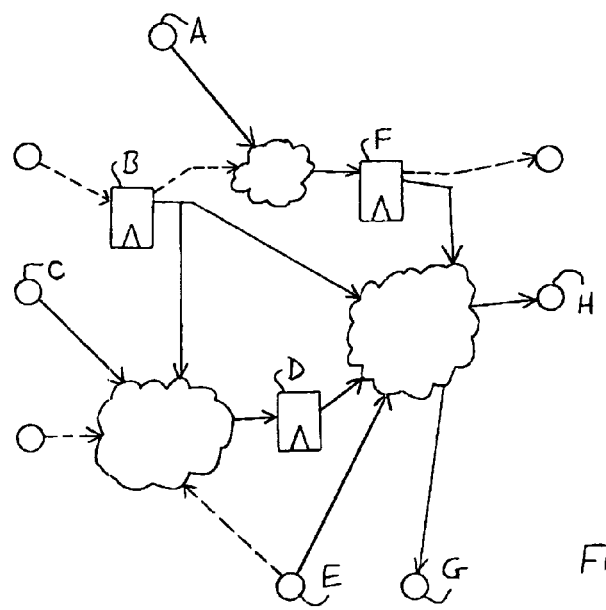
FIG. 2A
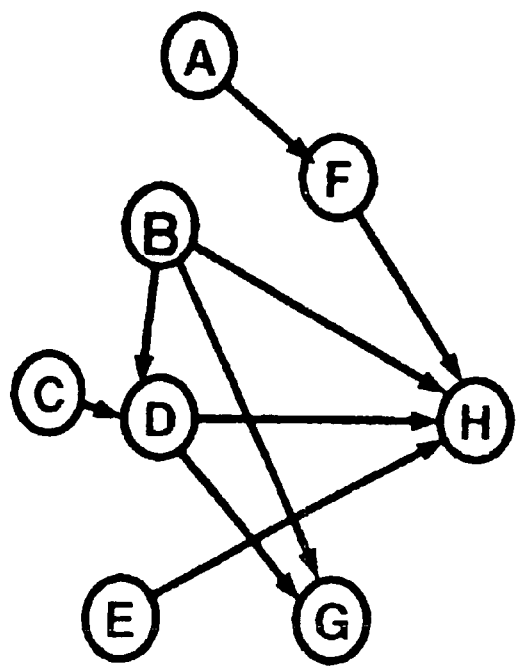
FIG. 2B
| Vertex | Adjacent vertices |
|---|---|
| A | F |
| B | D G H |
| C | D |
| D | H G |
| E | H |
| F | H |
| G | |
| H | |
FIG. 2C

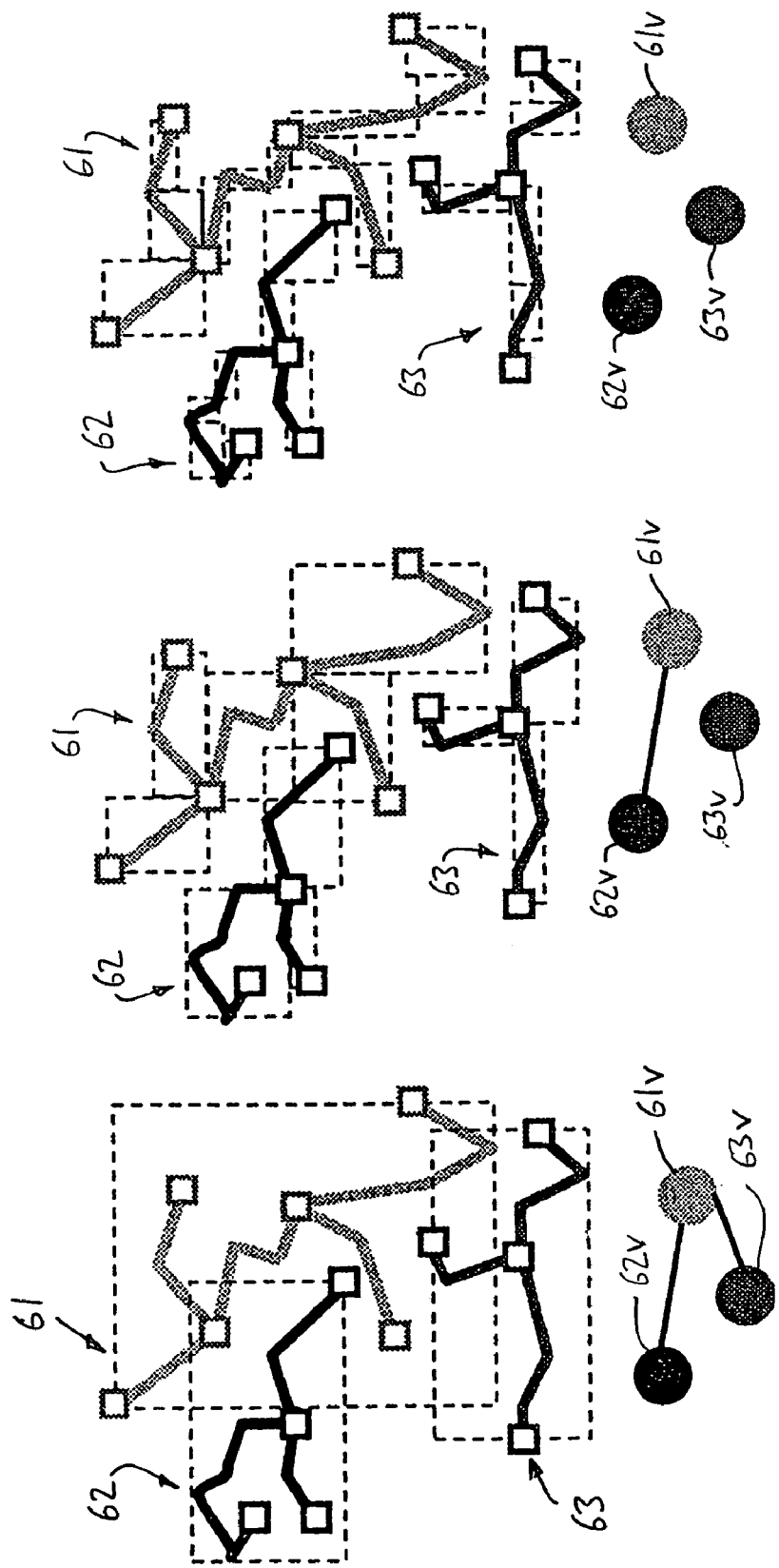

METHOD TO IDENTIFY GEOMETRICALLY NON-OVERLAPPING OPTIMIZATION PARTITIONS FOR PARALLEL TIMING CLOSURE

BACKGROUND OF THE INVENTION

This invention relates to optimization of microelectronic circuit designs, and more particularly to timing optimization in highly complex ASIC or microprocessor designs having a very large number of gates and a correspondingly very large number of circuit paths.

In today's ASIC or microprocessor designs it is very common to have chips that vary in size from several hundred thousand gates to several million gates. After placement these same chips have hundreds of thousands of paths where the calculated arrival time for a signal is greater that the required arrival time—a condition known in the art as negative slack. The optimization of these paths is a time-consuming operation in the order of several hours to tens and hundreds of hours. Therefore, finding ways to reduce the optimization time without degradation of results will significantly impact the development cycle of a design and reduce the time required to bring a new product to market.

It is desirable to perform partitioning of the chip design pattern, so that separate processors may work in parallel to analyze and optimize the timing of the circuit paths. For example, the circuit of FIG. 1A has a group of logic gates 1, and a timing path between timing points 2 and 3. A given circuit in general has multiple paths, with two given paths having either an endpoint in common or different endpoints. For example, in FIG. 1B three paths 4a, 4b, 4c have timing point 5 as an endpoint, and two paths 4a, 4b have timing point 6 as an endpoint. The two paths 7a and 7b, ending at point 8, are not physically connected to paths 4a–4c; the timing of paths 7a and 7b may thus be optimized in parallel with paths 4a–4c.

Conventional approaches to geometric partitioning and timing optimization will be described briefly as follows.

Geometric Partitioning

Given a graph G(V,E), where V is the set of weighted vertices and E is the set of weighted edges, the traditional partitioning problem is to divide the set V into k subsets, such that the number of edges straddling two partitions (edge cut) is minimized while the sum of vertex weight in each partition is balanced.

This problem is non-polynomial-complete; heuristic techniques have therefore been developed. Iterative-move based Kernighan-Lin (KL) and Fiduccia-Matthews (FM) algorithms were introduced in 1970's and 1980's. These algorithms work in iterations after an initial rough partition. In each iteration, vertices are moved from one partition to another or swapped between partitions, if the move/swap reduces the edge cut. As is known to those skilled in the art, these iterative heuristics are greedy algorithms, so they are heavily dependent of the initial partitioning, and likely trapped in a local optimum. The initial partitioning is typically done by arbitrary vertex selection or using breadth-first search methods.

Spectral partitioning algorithms such as those described by P. K. Chan et al. and K. M. Hall, on the other hand, attempt to treat the global view of graph. These algorithms first find and use the eigenvectors of a matrix representation of a given graph. The calculation complexity of eigenvectors increases quickly when the number of vertices increases. Therefore, this method is not directly used in large graphs.

Current partitioning schemes focus on multi-level techniques such as those described by G. Karypis et al. In multi-level partitioning, the initial set of vertices is grouped into sub-sets, and each sub-set is assigned a vertex. The grouping process is repeated for the new set of vertices. The partitioning process finishes when the graph size becomes small enough to be handled easily. After a good solution is found for the small graph, the graph is expanded iteratively into original graph. At each step of this uncoarsening step, the partition boundary is refined using modified FM algorithms, and the refinement step mainly determines the quality of the solution. Metis and hMetis from the University of Minnesota are widely-used public multi-level partitioning programs.

If more than one weight is associated with a vertex, then the problem is called multi-constraint partitioning problem, and the objective is to divide each weight evenly amongst partitions. For example, the weights could represent circuit element properties such as area and power, and one may seek a partitioning result where each partition has approximately the same amount of area and power. This is known as a 2-constraint partitioning problem. The Metis family of programs supports m-constraint problems.

All the above algorithms are generally applied for the netlist representation of circuit before placement, and each graph vertex does not have geometric information. Hence, if applied on a placed netlist, each partition can be geometrically disconnected. Geometric partitioning is partitioning for those graphs, whose vertices have geometric locations, and generates partitions which are geometrically connected.

Geometric partitioning on a mesh graph has usually focused more on balancing than net-cut minimization. Two-constraint graph partitioning has been suggested using a so-called Ham-Sandwich theorem, as discussed by J. M. Kleinhans et al. and A. Poe et al. Its suggested partitioning separators are a line with arbitrary slope, and the worst complexity can be $O(n^2)$. Two-constraint geometric graph partitioning with L-shape separator has been studied by one of the inventors, where the algorithm is applied to standard-cell placed circuit with $O(n \ln n)$ complexity.

More recently, C. Ababei et al. have described a timing-driven partitioning algorithm for a pre-placement design, in which a subset of the most critical paths is identified and optimized. However, this approach does not address the problem of post-placement optimization, or of optimization by processors running in parallel.

Timing Optimization

After initial placement, a timing analysis is run on the placed circuit and a list of timing paths is obtained, for example by using a timing analysis tool such as EinsTimer™. A timing path is an ordered sequence of timing points between two Significant Timing Points. A Significant Timing Point is a point where a timing goal is defined; in other words, it is any point in the design where timing information is asserted and therefore does not change with timing analysis. Examples of Significant Timing Points are: the input, output and clock pins of latches/registers, the primary inputs and outputs of the design, etc. Timing paths are classified in terms of slack which is an indication of how each point in the path is from its goal. The slack of a timing point $(S_{tpi})$ is defined as $S_{tpi}$=Required Arrival Time $(RAT_{tpi})$–Arrival Time $(AT_{tpi})$. If the slack is zero the point reached its goal, if it is positive the point is beyond the goal and if it is negative the point lacks the goal. The list of paths is ordered by slack, the paths with most negative slack being the first ones in the list. The negative slack paths indicate the areas in the design that require optimization to make the slack positive. These paths will be referred to as critical paths or timing critical paths.

Timing optimization is a step in the chip design process where timing critical paths are optimized such that no path is below a given target slack, usually zero. This step generally involves applying optimization techniques to the gates and interconnects (nets) in a timing path such that the overall delay is reduced. Examples of these optimization techniques are changing the size of gates; inserting buffers/inverters on nets; swapping pins between equivalent nets; gate cloning; decomposing gates into logic equivalents; etc. Timing optimization engines, such as PDS_refine™, use these techniques in several ways to achieve the desired results.

In order to reduce the long running times for circuit design optimization procedures, it is desirable to perform optimization in parallel to the greatest extent possible. However, conflicts may arise when attempting to optimize placed circuits, due to the lack of timing independence or physical independence of many circuit paths. As may be already seen from the highly simplified example of FIG. 1B, some timing paths occupy the same space, while other timing paths are physically independent. This means that optimization of some paths should not be performed in parallel, but instead should be assigned to the same processor.

There remains a need for a post-placement timing optimization procedure in which optimization may be performed by parallel processors.

SUMMARY OF THE INVENTION

In accordance with the present invention, a method is provided to speed up timing optimization after placement by parallelizing the optimization step. In particular, the method includes performing multiple partitions in the set of timing critical paths such that each partition can be optimized independently in a separate processor. To eliminate the need for inter-processor communication, conditions of timing independence and physical independence are imposed on each partition. In a given design it may not be possible to find a partition set that covers all the timing critical paths and satisfies the above-mentioned conditions. The number of iterations needed to optimize the design is determined, along with the number of processors needed (from a maximum possible of k processors) in each iteration, such that the timing critical paths are equally balanced between processors. It should be noted that this method is performed after placement of the components in the design.

In accordance with one aspect of the present invention a method for optimizing design of a microelectronic circuit using a plurality of processors is provided, where the design has a plurality of timing paths and a subset of the timing paths are characterized as critical paths, with each of the timing paths having an endpoint. This method includes the steps of constructing a list of the critical paths; constructing a set of endpoints of the critical paths; partitioning the set of endpoints; and optimizing timing of the critical paths. The partitioning is performed in accordance with predetermined rules regarding timing independence and geometric independence of the critical paths, thereby defining sub-sets of endpoints and paths associated therewith. The optimizing is performed in parallel by the processors, each of the processors optimizing timing of the paths associated with the endpoints in respective sub-sets. In constructing the set of endpoints, it is advantageous to construct an endpoint graph from the list of critical paths, where the endpoint graph has at least one vertex representing critical paths associated with a given endpoint. The partitioning step then includes the step of partitioning the endpoint graph to define sub-sets of vertices.

In accordance with another aspect of the invention, a method for optimizing design of a microelectronic circuit is provided which includes the steps of constructing a list of the critical paths; constructing an endpoint graph therefrom, where the endpoint graph has at least one vertex representing critical paths associated with a given endpoint; partitioning the endpoint graph; and optimizing timing of the critical paths. In this method, the partitioning is performed in accordance with predetermined rules regarding timing independence and geometric independence of the critical paths, thereby defining sub-sets of vertices of the endpoint graph. The optimizing includes the steps of identifying the endpoints represented by the vertices in a given sub-set of vertices; identifying all critical paths ending at the identified endpoints; generating design changes in the microelectronic circuit to optimize the identified critical paths, and storing said design changes in a memory unit. This optimizing may be performed in parallel by the respective processors, where each processor optimizes critical paths associated with a different sub-set of vertices of the endpoint graph; the design changes are stored in a plurality of memory units. A main memory is then updated by storing therein the design changes in the respective memory units after completion of optimization by all the processors. The optimizing and updating steps described above may be performed in a plurality of iterations.

According to another aspect of the invention, a computer-readable storage medium has instructions stored therein for performing the methods described just above.

BRIEF DESCRIPTION OF THE DRAWINGS

FIG. 2A schematically illustrates a circuit having several paths with timing violations.

FIG. 2B is a graphical representation of the circuit of FIG. 2A.

FIG. 2C presents the graph of FIG. 2B as a directed adjacency list.

FIGS. 6A–6C illustrate successive refinements of bounding boxes and cluster graphs for a group of paths.

DETAILED DESCRIPTION OF PREFERRED EMBODIMENTS OF THE INVENTION

In accordance with the present invention, a method for geometric partitioning will be described where the critical logic circuit paths are represented by a graph, and rules regarding timing independence and geometric independence are applied.

The input to the Geometric Partitioning problem consists of a sub-set of the list of paths; this sub-set contains all the paths whose slack is below a given threshold. For example this threshold could be zero or any other designer selected value. After the list of paths of interest is identified, the next step is to build a directed graph G (V, E) from the list of paths to identify the relationship amongst the paths.

Graph Representation of Critical Paths

Each directed edge E in graph G is a timing path from the list of paths. Each vertex V in the graph G is a Significant Timing Point. The combinational logic between the Significant Timing Points is abstracted in the edge. An example of a circuit, and a graph representing that circuit, are shown in FIGS. 2A and 2B. The solid lines in FIG. 2A represent paths with timing violations, while the dotted lines represent other non-critical timing paths. Endpoints of the critical paths, which are the vertices of the graph, are labeled A–H in FIGS. 2A and 2B. The directed graph G is also represented by a directed adjacency list as shown in FIG. 2C. A vertex $V_i$ is in the adjacent vertex list for a vertex $V_j$ if and only if the timing path from $V_j$ to $V_i$ has a slack less than the critical slack.

Timing Independence

Figure 1A:
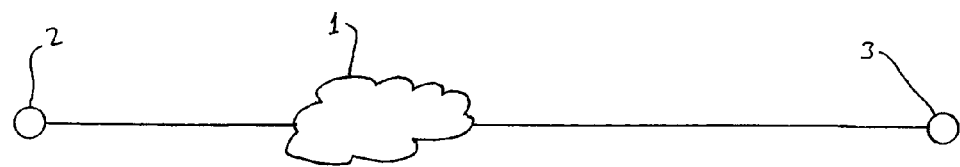
FIG. 1A schematically illustrates a timing critical path.
Figure 1B:
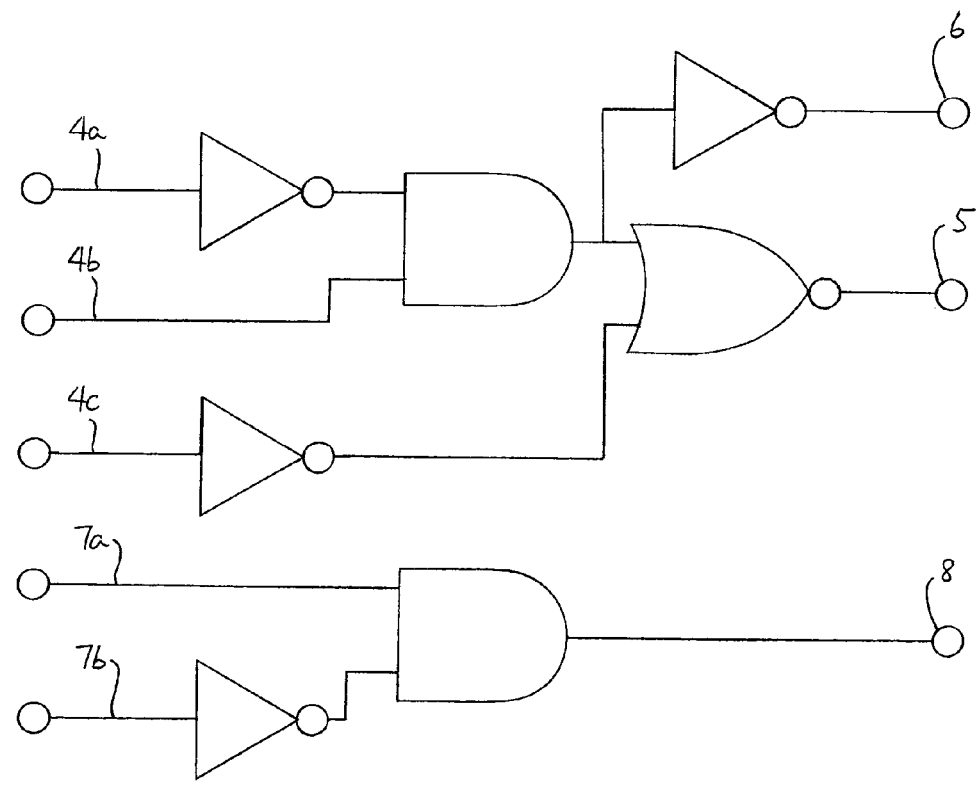
FIG. 1B shows a simplified example of logic gates with multiple paths.
Figure 3A:
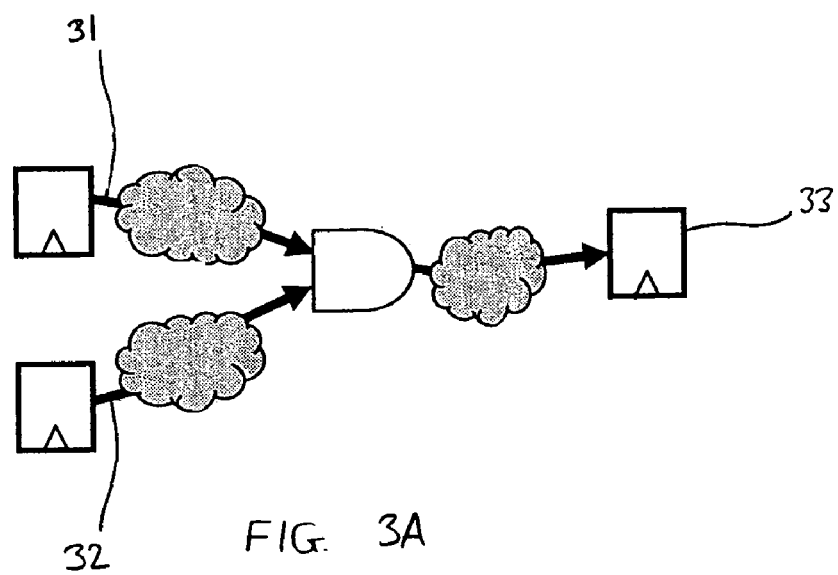
FIGS. 3A–3C show partitioning of two timing paths, illustrating the requirement of timing independence.
Figure 3B:
Figure 3C:
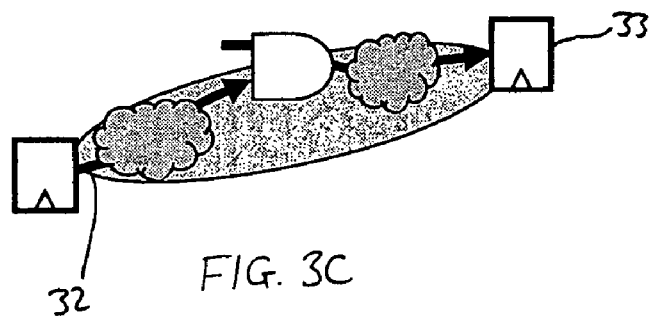

Timing Independence is the requirement that the paths being optimized in one partition are self-contained in that partition. This requirement allows the paths to be fully optimized within a partition without the need to communicate timing information between partitions. In graph G, a path is a connection through combinational logic between two Significant Timing Points. Paths that share combinational logic may have one or both Significant Timing Points in common. These paths must be in the same partition in order to obtain timing independence. However, paths that do not share combinational logic do not share Significant Timing Points and are timing independent. An example is shown in FIG. 3A where two timing paths 31, 32 feed a receiving register 33. If these paths were to be assigned to different partitions as illustrated in FIGS. 3B and 3C, the processors performing optimization would have to communicate information between partitions during the optimization. Therefore, the requirement of timing independence is enforced by ensuring that all the critical timing paths driving an endpoint stay in the same partition. This eliminates the need to have inter-processor communication during optimization.

Geometric Independence

Figure 4A:
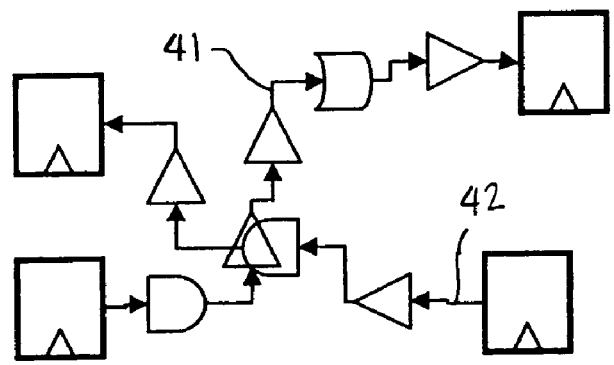
FIGS. 4A–4C show partitioning of two timing paths, illustrating the requirement of geometric independence.
Figure 4B:
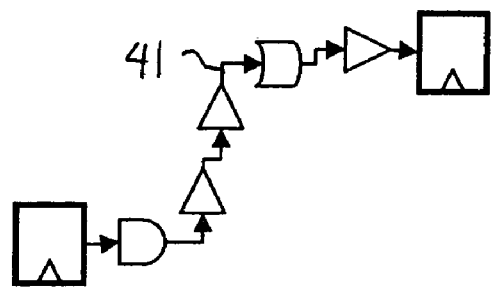
Figure 4C:
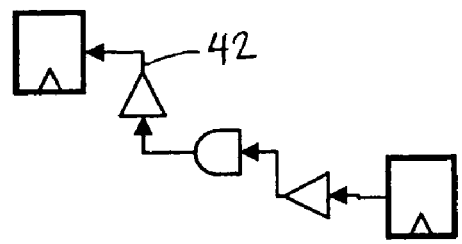

Timing independence is not the only requirement that needs to be satisfied to eliminate conflicts between partitions. Timing paths that are timing independent may share the same physical space. As the optimization procedure resizes gates or inserts buffers in the paths, the new changes will compete for potentially the same physical space. Therefore, to guarantee that the optimization reflects the results based on available real estate, another requirement is imposed on partitioning. This requirement is called geometric independence and it is illustrated in FIGS. 4A–4C. In FIG. 4A, two paths 41, 42 that are timing independent share a common placement area. If there is no requirement for geometric independence, the two paths 41, 42 would possibly be assigned to different partitions, as shown in FIGS. 4B and 4C. In this case there would be an area resource conflict when the results are brought back together, which in turn might have an adverse impact on the optimization results. To avoid this problem, paths that share the same physical area should not be optimized at the same time in different partitions. It is noteworthy that if the paths are connected to the same endpoint, the previous requirement ensures that they go to the same partition independent if they share the same physical area or not.

If there is geometric dependency between paths, it is necessary to have multiple iterations of optimization in order to optimize the design without inter-processor communication. The partitions that are timing and geometric independent are optimized by as many processors as are available.

Cluster Graph

Figure 5A:
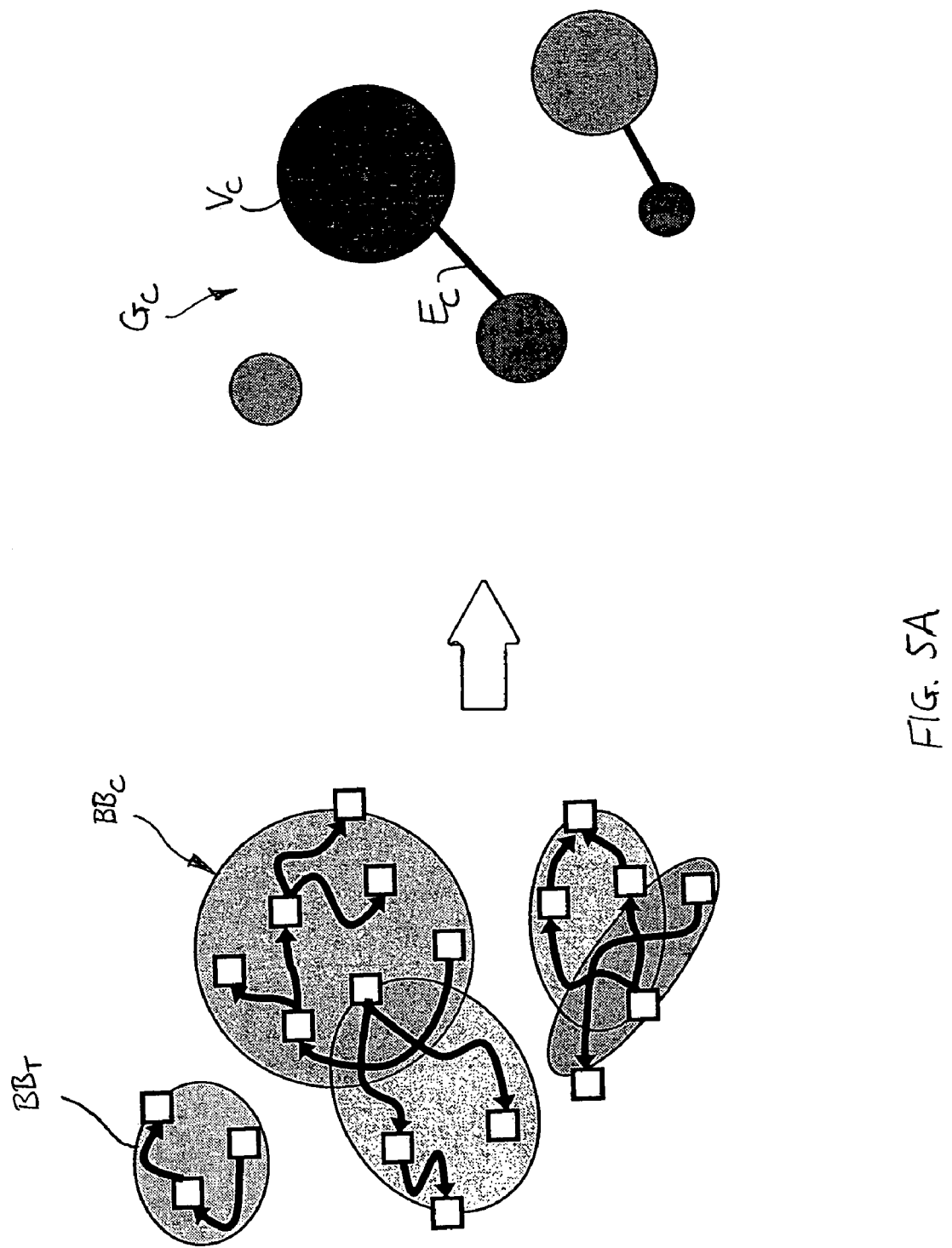
FIG. 5A schematically illustrates representation of timing paths in a cluster graph.

For partitioning and scheduling purposes the graph of critical paths is translated into two other structures. The first data structure is the Cluster Graph. This graph represents two types of data. The first type identifies and represents the logic connectivity of timing critical paths. An aggregation of timing connected critical paths is termed a cluster. During the connectivity identification the physical geometry of each timing path (Timing Bounding Box, $BB_T$) is also registered. At the end of connectivity identification each cluster has a Cluster Bounding Box ($BB_C$), which is the union of all the $BB_T$ in the cluster. The second type of data in this graph is the physical overlap between Cluster Bounding Boxes. Therefore, the Cluster Graph $G_C(V_C, E_C)$ is an indirect graph where a cluster is a vertex $V_C$ and the physical overlap is represented by an edge $E_C$ (see FIG. 5A).

Figure 5C:
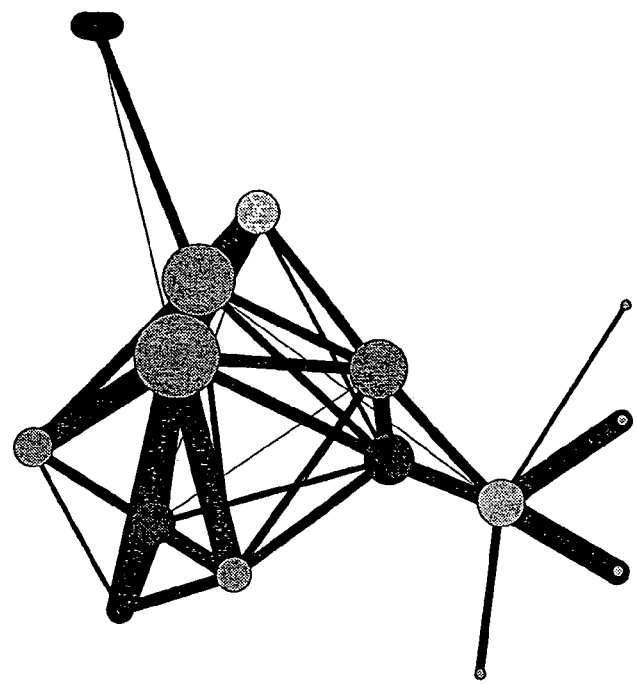
FIG. 5C schematically illustrates a cluster graph derived from the bounding boxes of FIG. 5B.
Figure 5B:
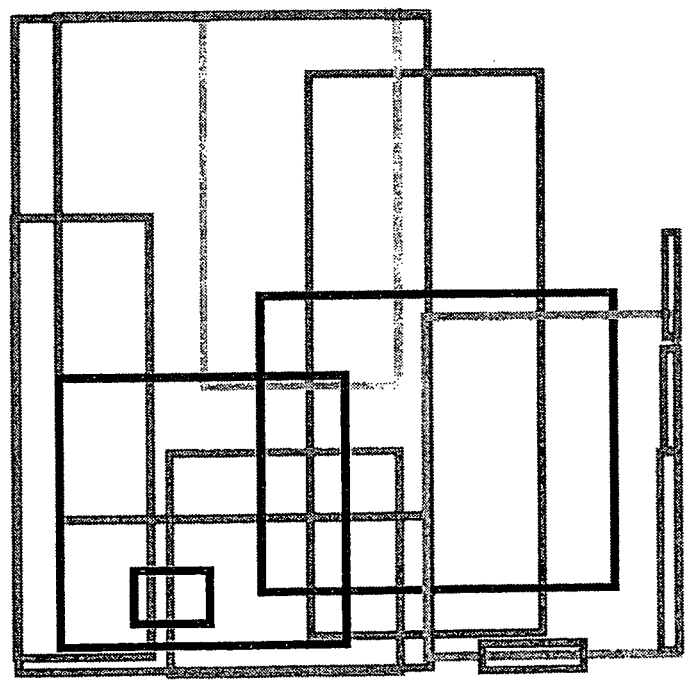
FIG. 5B illustrates cluster bounding boxes.

In FIGS. 5B and 5C, a clustering example extracted from an actual chip is illustrated. After initial placement and timing analysis, about 3000 paths with negative slack were found. Then clustering based on connectivity was performed for those paths, resulting in 80 clusters of various sizes. In FIG. 5B, the bounding box of each cluster is drawn with respect to the chip area. In FIG. 5C a graph showing the geometric relationship between cluster bounding boxes is illustrated. In this graph, the size of a vertex is proportional to the cluster bounding box area, and the edge width reflects the amount of overlap between two clusters.

It should be noted that using a single bounding box to represent a cluster is very conservative in the sense that a bounding box covers much more than the actual space occupied by the cells and nets in a path. This is illustrated in FIGS. 6A–6C, showing successive refinement of bounding box and cluster graph representations for three clusters whose paths do not overlap. In FIG. 6A, each of three clusters 61, 62, 63 has a single bounding box, with the result that the cluster graph has three vertices 61v, 62v, 63v and two edges. In FIG. 6B, the bounding box for each cluster is the union of the bounding boxes for the paths within that cluster; the bounding box of cluster 63 thus no longer overlaps that of cluster 61, so an edge is eliminated from the cluster graph. In FIG. 6C, the bounding box for each cluster is the union of the bounding boxes for the gates and nets within each path in that cluster; none of the boxes now overlap, so the three vertices of the cluster graph are no longer connected.

If the clustering result provides geometrically disconnected clusters, one can assign clusters to processors without the concern about conflict between processes, and the cluster partitioning will become a load balancing problem. However, as can be seen in FIG. 5B, very often clusters overlap each other. Furthermore, the size of clusters varies dramatically, some having a few paths and others having many thousands of paths. To achieve physical independence as well as timing independence, the partitioning algorithm must find within the large cluster sets sub-sets that can be optimized independently without the need to communicate timing or placement information between the sub-sets. This is accomplished with the second data structure, the Endpoint Graph.

Endpoint Graph

Figure 7A:
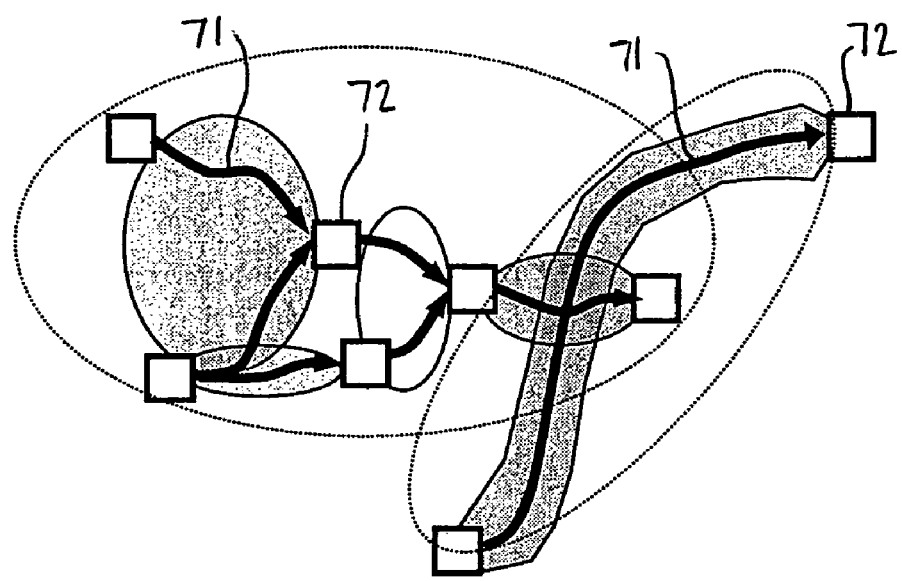
FIG. 7A schematically illustrates a group of paths and the physical and logical relationship between those paths.
Figure 7B:
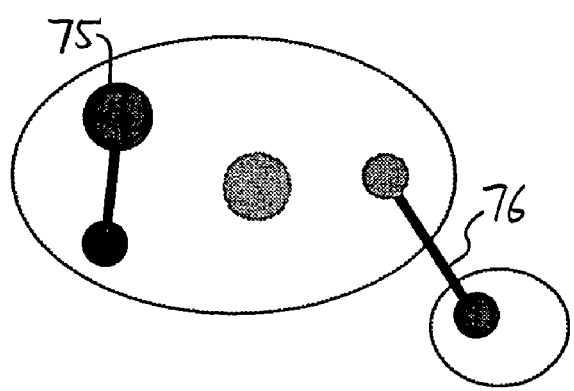
FIG. 7B shows an endpoint graph representing the paths in FIG. 7A.

In a preferred embodiment of the invention, the Endpoint Graph is the entry point to the partitioning procedure. It is an indirect graph built from the graph representing the list of timing critical paths. For example, FIG. 7A shows the logical and physical relationship between paths 71 with endpoints 72; the corresponding endpoint graph is shown in FIG. 7B. In this graph each vertex 75 is a collection of timing paths that drive an endpoint. Each edge 76 represents physical overlap between paths of two different endpoints. Each vertex has a weight associated therewith that represents the number of timing critical paths associated with each endpoint.

From a partitioning standpoint, the processing of the endpoint graph finds a number of endpoints that do not physically overlap with each other and other endpoints. This partitioning process is then used to drive the scheduling of processors to parallelize the timing optimization task.

Given graph G(V, E, w), where V is a set of vertices, E is a set of edges, and w(v) is a weight function associated with the vertices, and given a maximum number of processors k, the partitioning process will involve these tasks:

(1) Find a number of iterations m
(2) Find a number of processors per iteration $k_i \leq k$
(3) Divide the vertex set V into subsets $(V_1^1, V_2^1, \ldots, V_{k_1}^1), (V_1^2, \ldots, V_{k_2}^2), \ldots, (V_1^m, \ldots, V_{k_m}^m)$, such that:

(i) $\bigcup_{i,j} V_j^i = V$, and $V_{j_1}^{i_1} \cap V_{j_2}^{i_2} = \phi$, if $(i_1, j_1) \neq (i_2, j_2)$, ($V_j^i$ is a partition)

(ii) $\forall i, \{e | e=(u, v), u \in V_{j_1}^i, v \in V_{j_2}^i, j_1 \neq j_2\} = \phi$, (within iteration i there is no edge crossing)

Figure 8:
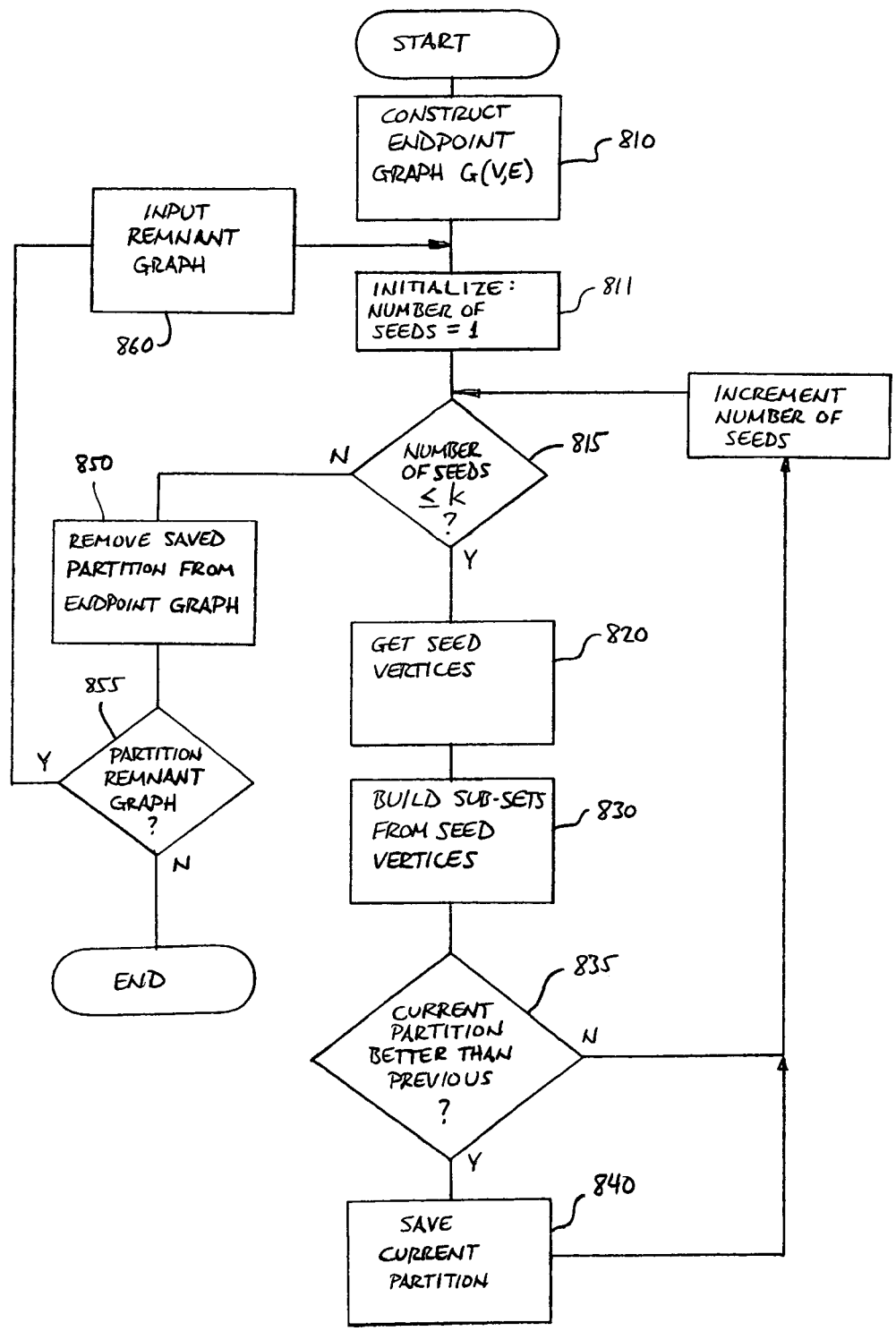
FIG. 8 is a flowchart showing steps in a geometric partitioning procedure for an endpoint graph.

(iii) Minimize $\sum_{i=1}^{m} \max_j (w(V_j^i))$, while $w(V_j^i) = \sum_{v \in V_j} w(v)$ FIG. 8 illustrates the partitioning process as a flowchart. The process begins with construction of the endpoint graph G from the list of timing critical paths (step 810). A set of endpoint graph vertices is then chosen from which the sub-sets will be obtained; these vertices are called seeds (step 820). Vertices with very high edge connectivity and a high number of timing paths are suitable seed candidates. Each seed becomes the first vertex in its respective sub-set. Each sub-set is then built up (step 830) with the maximum possible number of vertices such that they satisfy the requirements of timing independence and geometric independence. It should be noted that when these requirements are imposed, it may not be possible to divide the entire graph into sub-sets. Those vertices that cannot be assigned to a sub-set will form the Remnant Graph, discussed in more detail below.

Steps 820 and 830 are repeated k times; the first time with one seed (step 811), the second time with two seeds, and the last time with k seeds (step 815). Each solution is compared to the previous one (step 835) and the one that gives the best set of sub-sets is kept (step 840). The best set of sub-sets, the chosen partition solution, is the solution that maximizes the number of vertices chosen and has these vertices equally distributed between the sub-sets.

The vertices in the partitioned sub-sets are then removed from the original endpoint graph G (step 850). Each sub-set will be optimized by a single processor in one iteration of timing optimization, as discussed below with reference to FIG. 11.

The leftover graph (that is, all vertices not yet included in the partition solution), also called the Remnant Graph, becomes the input graph (step 860) and goes through the process previously described to obtain another iteration of optimization. This process is repeated until it is determined (step 855) that the size of the Remnant Graph is not large enough for parallel optimization. (This graph size depends upon the computing resources available and is often determined empirically.)

Figure 9C:
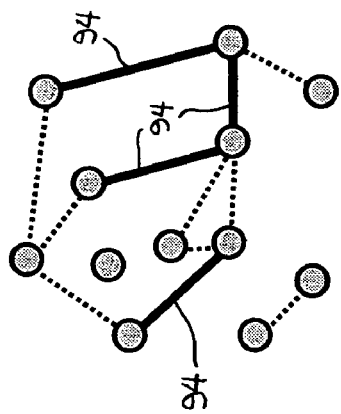
FIGS. 9A–9C illustrate steps in a partitioning and optimization procedure leading to conflict in optimization due to geometric overlap.
Figure 9B:
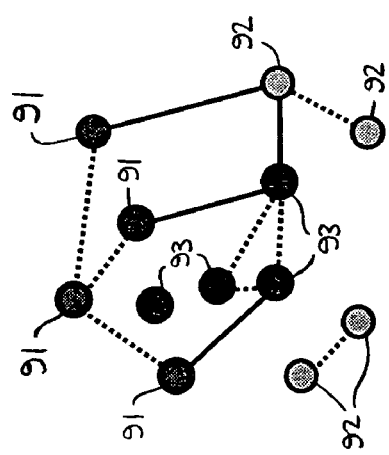
Figure 9A:
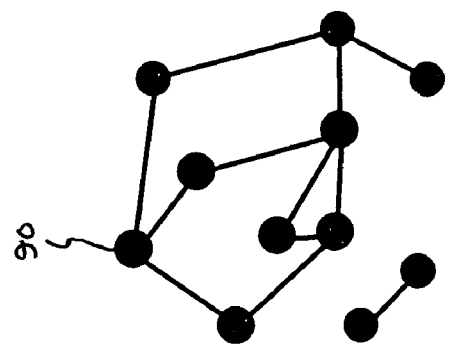

FIGS. 9A–9C illustrate steps in a partitioning and optimization procedure with an endpoint graph having paths that overlap geometrically when there are 3 processors (k=3). In the procedure of FIGS. 9A–9C, the assignment of vertices attempts to maximize the number of vertices per processor while ensuring that each processor is assigned a similar number of vertices. The endpoint graph of FIG. 9A has twelve vertices 90; each of the three processors is assigned four vertices 91, 92, 93 respectively (FIG. 9B). Although all the vertices can be processed at the same time, the geometric overlap between paths implies that when the optimization results are brought together the various partitions will be competing for the same physical space. This is illustrated in FIG. 9C, where the solid lines 94 represent geometric dependence between vertices optimized by different processors. The process of removing physical overlap between cells, thereby permitting a workable device to be built, is known in the art as placement legalization. The results of an optimization procedure such as in FIGS. 9A–9C are not guaranteed to be accurate, because after placement legalization, a significant portion of optimization could be nullified. It is assumed that that the cost of optimizing each vertex is similar.

Figure 10A:
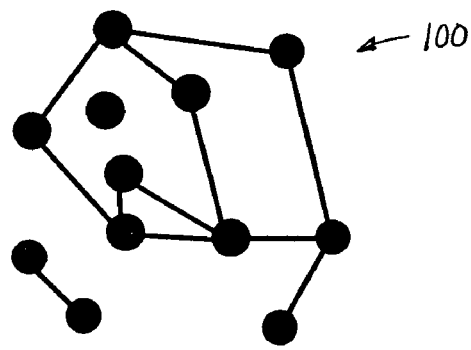
FIGS. 10A–10E illustrate steps in a partitioning and optimization procedure in accordance with the present invention, leading to elimination of conflicts.
Figure 10B:
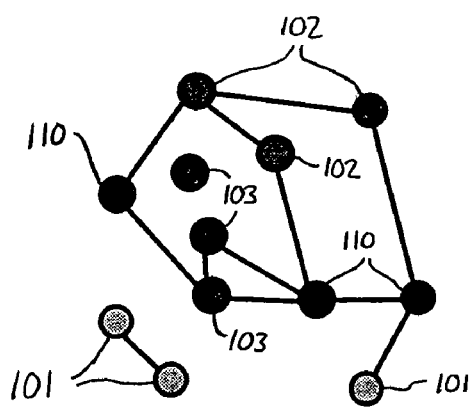
Figure 10C:
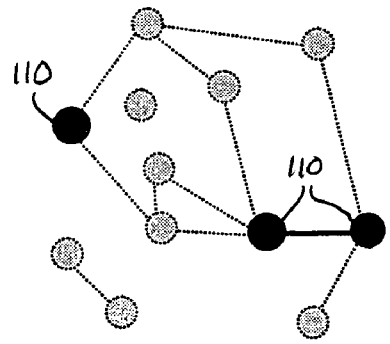
Figure 10D:
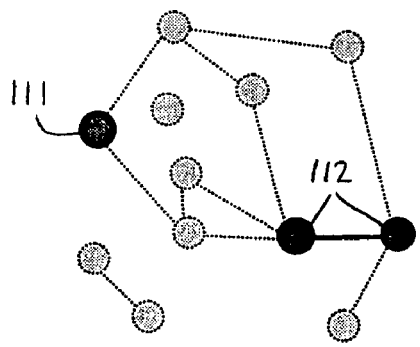
Figure 10E:
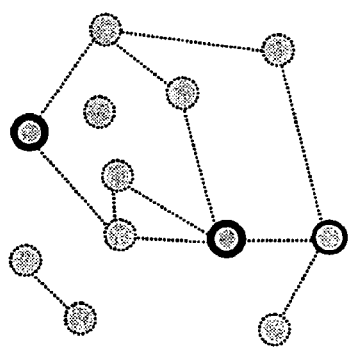

An optimization procedure in accordance with the present invention uses the partitioning scheme discussed above to determine sub-sets of vertices that can be optimized in parallel. This procedure avoids the risk of degradation of results after the partial solutions are brought back together, because each partition does not share the same physical area. This parallel optimization procedure is illustrated in FIGS. 10A–10E. The first step is to apply the partitioning strategy to the endpoint graph 100 to determine the maximum number of vertices that can be assigned to the maximum number of available processors. These vertices are assigned to the processors such that the load on each processor is equally distributed amongst the processors. The term "load" here refers to the complexity of the graph; one convenient measure of load is the number of timing paths to be optimized (as is discussed in "Optimization and Chip Design Flow" below). The partitioning procedure thus attempts to balance the number of paths to optimize amongst each processor. In FIG. 10B, three sub-sets of vertices 101, 102, 103 are assigned to the three processors respectively. In contrast to the procedure shown in FIGS. 9A–9C, vertices 110 are not assigned to a processor and not optimized at this point in the process. The non-optimized vertices 110 are identified in the leftover graph (FIG. 10C), also known as the Remnant Graph, and carried on to the next iteration. Partitioning and optimization is then performed on the Remnant Graph. As shown in FIG. 10D, this can be done with two processors, optimizing vertices 111 and 112 respectively. This process is repeated until the Remnant Graph is empty or left with a sub-set of vertices that cannot be partitioned; this sub-set is then optimized by a single processor. In this example, optimization of the initial graph 100 with the same number of processors requires two iterations to obtain a solution without conflicts (FIG. 10E); that is, each processor optimizes a geometrically independent sub-set of vertices of the endpoint graph. This in turn ensures that the results obtained at the end of parallel optimization will not be compromised when the results of each partition are brought back together.

Another characteristic of the partitioning algorithm is the ability to partition the input graph G before optimization. Furthermore, the number of iterations and processors per iteration are determined prior to the actual optimization runs.

The use of the partitioning algorithm within optimization is straightforward. Timing optimization engines work on a list of critical elements. This list could be the list of most critical nets and/or the list of most critical gates; alternatively, the engine could get directly the list of critical timing paths and select the most critical gates and nets from this list. The advantage of using the list of critical timing paths is that this list is derived from the same list used in the partitioning algorithm. A feature of the path based optimization is that the user can select the paths for which optimization is desired. This selection is based on several criteria, one of them being a list of endpoints. It should be noted that the partitioning procedure assigns to a partition a set of paths connected to a set of endpoints. If these endpoints are also passed to the optimization engine, only the paths terminating on the endpoints will be optimized.

Figure 11:
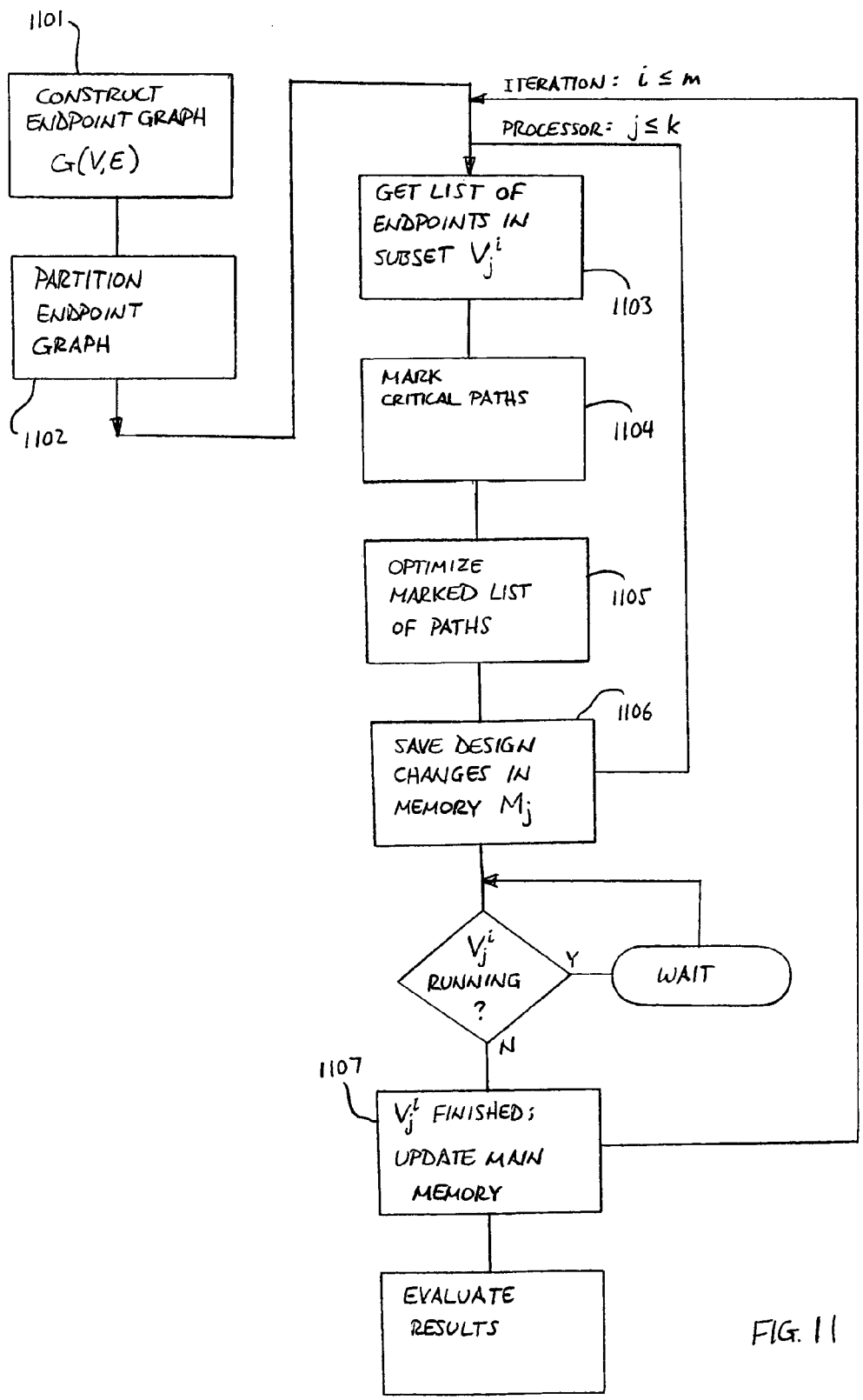
FIG. 11 is a flowchart showing steps in a parallel optimization method in accordance with the present invention.

A parallel optimization procedure using the partitioning techniques is illustrated in FIG. 11. The endpoint graph is constructed (step 1101) and partitioned (step 1102) according to the partitioning procedure described above. The core of the optimization procedure is the four inner steps 1103–1106 shown in FIG. 11; these steps are performed by each of the k processors. The first step 1103 is a compilation of the endpoints on each partition. In the second step 1104 the list of critical paths is searched, and every path finishing at an identified endpoint is marked for optimization. The third step 1105 actually performs the optimization on the list of critical paths, touching only the gates and nets associated with the marked paths. The fourth step 1106 saves the optimization results of each partition in a separate intermediate memory. These results are updated into the main memory after all the processors within iteration i have finished the job (step 1107). The optimization continues to the next iteration. It is noteworthy that the partitions per iteration and the number of iterations are predetermined by the partitioning strategy and should cover all the endpoints in the list of critical timing paths. The update of the main memory after each iteration guarantees that the next iteration sees the optimization effects on shared paths.

The above-described procedure may be implemented with few changes in chip design flow. In a typical flow, the design is initially placed with a placement tool such as CPlace™ or a Timing Driven Flow such as PDS_FullPlace™. The outcome is that each gate in the design occupies a non-overlapping place on the chip. The design is then timed with a timing analysis tool such as EinsTimer™. The procedure of the present invention is evaluated in the same manner. After timing analysis, timing optimization is run on the full chip and if closure is achieved other steps follow such as wiring. Likewise in the practice of the present invention, optimization is run starting with a full chip. As in a typical chip design flow, the process is repeated until timing closure is achieved.

Partitioning and Optimization Results

In order to validate the partitioning algorithm and optimization strategy, a prototype code was developed and run on several ASIC designs. Some important characteristics of the testcases are illustrated in Table 1. The starting point is a design where the gates have been placed with a placement tool, such as Cplace™, attempting to minimize wiring connectivity. Static timing analysis is then run on each testcase to get the list of critical timing paths. From that point on the clustering and graph building techniques take over to get the endpoint graph, where endpoints are represented by vertices and the physical overlap between paths are the overlap edges. As expected the endpoint graph is a dense graph with each vertex connected too many other vertices. A measurement of the connectivity is also shown for each testcase. In Table 1 the Connectivity column represents the average connectivity of each vertex in the endpoint graph. The average connectivity is determined by divided the average vertex connectivity by the total number of vertices. In the examples below this connectivity varies from around 10% (each vertex is connected to one in every 10 vertices) to up to almost 50% (each vertex is connected to one in every two vertices).

TABLE 1

| Testcase | Placeable Gates | Critical paths | Endpoint Graph Vertices | Overlap Edges | Connectivity |
| --- | --- | --- | --- | --- | --- |
| Design 1 | 211K | 13767 | 7992 | 2762057 | (687/7992) 8.6% |
| Design 2 | 69K | 4049 | 1138 | 315206 | (554/1138) 49% |
| Design 3 | 161K | 7952 | 4745 | 3386112 | (1427/4745) 30% |
| Design 4 | 303K | 13720 | 6803 | 1927201 | (566/6803) 8.3% |
| Design 5 | 311K | 16260 | 9501 | 6871034 | (1446/9501) 15.2% |
| Design 6 | 504K | 18330 | 12428 | 7486240 | (1205/12428) 9.7% |

The partitioning algorithm was applied to the endpoint graph of each design and the results are illustrated in Table 2. The first row has the number of iterations determined for each design. For example, Design 2 only requires two iterations. For each design the first row is the number of processors determined per iteration from a maximum pull of 6 processors. In Design 6, the first iteration uses 5 processors; the second iteration uses 6 processors, etc. The second row is the percentage of critical paths worked on. In Design 6, 26% of the paths are worked on the first iteration, 20% in the second, etc. The third row is an estimate of optimization processing timing. Without running optimization the assumption was made that each critical timing path would take the same time to optimize. Therefore, without parallelization each design would need T time to optimize all the critical timing paths. With parallelization, a portion of this time is used per iteration. The reported value is the time spent by the largest partition in the iteration relative to the non-parallel optimization. In Design 6, the first iteration uses only 0.05 of non-parallel optimization which is spent on the largest of the five partitions of 916 paths. The second iteration uses only 0.03 of non-parallel optimization on the largest of six partitions of 550 paths.

Although the optimization time is not a true measure of the real optimization time it is an indication of the potential of speed up in optimization by using multiple processors. The true measure requires the inclusion of the overhead time spent in partitioning, the actual optimization time of each partition (which is a function of the characteristics of each path and the techniques applied to the path) and the time spent updating the results to the main netlist between iterations.

TABLE 2

|        | Iteration | 1 | 2 | 3 | 4 | 5 | 6 | 7 | 8 | Sum |
|--------|-----------|---|---|---|---|---|---|---|---|-----|
| Des. 2 | # Proc.   | 2 | 1 | | | | | | | |
|        | # paths   | 1509 | 2540 | | | | | | | 4049 |
|        | Opt work  | 37% | 63% | | | | | | | 100% |
|        | Time      | 0.19 | 0.63 | | | | | | | 0.82 |
| Des. 3 | # Proc.   | 6 | 3 | 2 | 2 | 1 | | | | |
|        | # paths   | 1475 | 982 | 993 | 419 | 4083 | | | | 7952 |
|        | Opt work  | 19% | 12% | 13% | 5% | 51% | | | | 100% |
|        | Time      | 0.03 | 0.04 | 0.06 | 0.03 | 0.51 | | | | 0.68 |
| Des. 5 | # Proc.   | 6 | 6 | 3 | 3 | 2 | 2 | 1 | | |
|        | # paths   | 2077 | 3460 | 1213 | 1270 | 1537 | 674 | 6028 | | 16260 |
|        | Opt work  | 13% | 21% | 8% | 8% | 10% | 4% | 37% | | 100% |
|        | Time      | 0.04 | 0.04 | 0.03 | 0.03 | 0.05 | 0.02 | 0.36 | | 0.57 |
| Des. 6 | # Proc.   | 5 | 6 | 6 | 5 | 4 | 4 | 2 | 1 | |
|        | # paths   | 4671 | 3587 | 1737 | 1331 | 1278 | 1628 | 1833 | 2265 | 18330 |
|        | Opt work  | 26% | 20% | 10% | 7% | 7% | 9% | 10% | 12% | 100% |
|        | Time      | 0.05 | 0.03 | 0.02 | 0.01 | 0.02 | 0.02 | 0.05 | 0.12 | 0.33 |
| Des. 1 | # Proc.   | 6 | 5 | 5 | 4 | 2 | 2 | 1 | | |
|        | # paths   | 4670 | 1137 | 1157 | 1215 | 1785 | 1609 | 2194 | | 13767 |
|        | Opt work  | 34% | 8% | 8% | 9% | 13% | 12% | 16% | | 100% |
|        | Time      | 0.06 | 0.02 | 0.02 | 0.02 | 0.06 | 0.06 | 0.16 | | 0.40 |
| Des. 4 | # Proc.   | 6 | 6 | 5 | 3 | 2 | 2 | 1 | | |
|        | # paths   | 3955 | 2231 | 1488 | 1336 | 877 | 784 | 3046 | | 13720 |
|        | Opt work  | 29% | 16% | 11% | 10% | 6% | 6% | 22% | | 100% |
|        | Time      | 0.05 | 0.03 | 0.02 | 0.03 | 0.03 | 0.03 | 0.22 | | 0.41 |

The results of Table 1 and Table 2 also demonstrate an expected result of this procedure For designs with higher vertex connectivity the ability to parallelize optimization diminishes. This is expected because higher connectivity implies that the paths physically overlap many other vertices and the number of partitions satisfying both timing and geometric independence diminishes.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A method for optimizing design of a microelectronic circuit using a plurality of processors, the design having a plurality of timing paths, a subset of the timing paths being characterized as critical paths, each of the timing paths having an endpoint, the method comprising the steps of:
    constructing a list of the critical paths;
    constructing a set of endpoints of said critical paths;
    partitioning said set of endpoints in accordance with a first predetermined rule regarding timing independence of the critical paths and a second predetermined rule regarding geometric independence of the critical paths, thereby defining sub-sets of endpoints and critical paths associated therewith,
    wherein said first predetermined rule requires that all critical paths associated with a given endpoint are assigned to a same sub-set of paths and said second predetermined rule requires that all overlapping critical paths are assigned to a same sub-set of paths; and
    optimizing timing of the critical paths,
    wherein
    said optimizing is performed in parallel by the processors, each of the processors optimizing timing of the critical paths associated with the endpoints in respective sub-sets, and the microelectronic circuit includes a multiplicity of components, and said method is performed after placement of the components in the design.

2. A method according to claim 1, wherein
    said step of constructing the set of endpoints comprises constructing an endpoint graph from the list of critical paths, the endpoint graph having at least one vertex representing critical paths associated with a given endpoint; and
    said partitioning step comprises partitioning the endpoint graph to define sub-sets of vertices.

3. A method according to claim 1, wherein in accordance with the first predetermined rule, all critical paths associated with a given endpoint are optimized using a same processor.

4. A method according to claim 1, wherein in accordance with the second predetermined rule, all overlapping critical paths are optimized using a same processor.

5. A method according to claim 2, wherein the endpoint graph has at least one edge connecting two vertices, the edge representing overlap between critical paths associated with endpoints represented by the respective two vertices.

6. A method according to claim 5, wherein
    said partitioning step is performed in a plurality of iterations;
    in a given iteration, a vertex belonging to a given sub-set does not belong to any other sub-set; and
    vertices belonging to distinct sub-sets are not connected by an edge.

7. A method according to claim 1, wherein said partitioning step and said optimizing step are performed in a plurality of iterations, so that critical paths not meeting said predetermined rules in a first iteration are not optimized in the first iteration.

8. A method according to claim 7, further comprising the steps of:
  determining a number of iterations needed to optimize the design; and
  determining a number of processors needed in each iteration, such that a maximum possible number of critical paths is equally balanced between processors.

9. A method according to claim 2, wherein
  said partitioning step and said optimizing step are performed in a plurality of iterations, so that critical paths not meeting said predetermined rules in a given iteration are not optimized in that iteration, and
  in a subsequent iteration of said partitioning step, said partitioning comprises constructing a remnant graph having vertices representing endpoints of non-optimized critical paths.

10. A method according to claim 2, further comprising the step, prior to constructing the endpoint graph, of constructing a graph of the critical paths characterized as a cluster graph, the cluster graph having vertices where each vertex represents a plurality of connected critical paths.

11. A method according to claim 10, wherein the cluster graph has at least one edge connecting two vertices, the edge representing overlap between areas occupied by paths represented by the respective vertices.

12. A method for optimizing design of a microelectronic circuit using a plurality of processors, the design having a plurality of timing paths, a subset of the timing paths being characterized as critical paths, each of the timing paths having an endpoint, the method comprising the steps of:
  constructing a list of the critical paths;
  constructing an endpoint graph from the list of critical paths, the endpoint graph having at least one vertex representing critical paths associated with a given endpoint;
  partitioning the endpoint graph in accordance with a first predetermined rule regarding timing independence of the critical and a second predetermined rule regarding geometric independence of the critical paths, thereby defining sub-sets of vertices of the endpoint graph wherein said first predetermined rule requires that all critical paths associated with given endpoint are assigned to a same sub-set of paths and said second predetermined rule requires that all overlapping critical paths are assigned to a same sub-set of paths; and
  optimizing timing of the critical paths, said optimizing including the steps of
  identifying the endpoints represented by the vertices in a given sub-set of vertices,
  identifying all critical paths ending at said identified endpoints,
  generating design changes in the microelectronic circuit to optimize said identified critical paths, and
  storing said design changes in a memory unit,
  wherein
  the microelectronic circuit includes a multiplicity of components,
  said optimizing is performed in parallel by the respective processors, each processor optimizing critical paths associated with a different sub-set of vertices of the endpoint graph, and said method is performed after placement of the components in the design.

13. A method according to claim 12, wherein the design changes are stored in a plurality of memory units, and further comprising the step of updating a main memory by storing therein the design changes in the respective memory units after completion of optimization by all the processors.

14. A method according to claim 13, wherein said optimizing and said updating are performed in a plurality of iterations.

15. A method according to claim 13, further comprising the step of evaluating results of said optimizing by performing a timing analysis of the critical paths.

16. A method according to claim 1, wherein each of the timing paths has an arrival time for a signal on that path, and a critical path is characterized as having an arrival time greater than a required arrival time.

17. A method according to claim 12 wherein each of the timing paths has an arrival time for a signal on that path, and a critical path is characterized as having an arrival time greater than a required arrival time.

18. A computer-readable storage medium having stored therein instructions for performing a method for optimizing design of a microelectronic circuit using a plurality of processors, the design having a plurality of timing paths, a subset of the timing paths being characterized as critical paths, each of the timing paths having an endpoint, the method comprising the steps of:
  constructing a list of the critical paths;
  constructing a set of endpoints of said critical paths;
  partitioning said set of endpoints in accordance with a first predetermined rule regarding timing independence of the critical paths and a second predetermined rule regarding geometric independence of the critical paths, thereby defining sub-sets of endpoints and critical paths associated therewith,
  wherein said first predetermined rule requires that all critical paths associated with a given endpoint are assigned to a same sub-set of paths and said second predetermined rule requires that all overlapping critical paths are assigned to a same sub-set of paths; and
  optimizing timing of the critical paths,
  wherein
  said optimizing is performed in parallel by the processors, each of the processors optimizing timing of the critical paths associated with the endpoints in respective sub-sets, and
  the microelectronic circuit includes a multiplicity of components, and said method is performed after placement of the components in the design.

19. A computer-readable storage medium according to claim 18, wherein
  said step of constructing the set of endpoints comprises constructing an endpoint graph from the list of critical paths, the endpoint graph having at least one vertex representing critical paths associated with a given endpoint; and
  said partitioning step comprises partitioning the endpoint graph to define sub-sets of vertices.

20. A computer-readable storage medium having stored therein instructions for performing a method for optimizing design of a microelectronic circuit using a plurality of processors, the design having a plurality of timing paths, a subset of the timing paths being characterized as critical paths, each of the timing paths having an endpoint, the method comprising the steps of:

constructing a list of the critical paths;

constructing an endpoint graph from the list of critical paths, the endpoint graph having at least one vertex representing critical paths associated with a given endpoint;

partitioning the endpoint graph in accordance with a first predetermined rule regarding timing independence of the critical paths and a second predetermined rule regarding geometric independence of the critical paths, thereby defining sub-sets of vertices of the endpoint graph wherein said first predetermined rule requires that all critical paths associated with given endpoint are assigned to a same sub-set of paths and said second predetermined rule requires that all overlapping critical paths are assigned to a same sub-set of paths; and optimizing timing of the critical paths, said optimizing including the steps of identifying the endpoints represented by the vertices in a given sub-set of vertices, identifying all critical paths ending at said identified endpoints, generating design changes in the microelectronic circuit to optimize said identified critical paths, and storing said design changes in a memory unit, wherein the microelectronic circuit includes a multiplicity of components, said optimizing is performed in parallel by the respective processors, each processor optimizing critical paths associated with a different sub-set of vertices of the endpoint graph, and said method is performed after placement of the components in the design.

21. A computer-readable storage medium according to claim 20, wherein the design changes are stored in a plurality of memory units, and further comprising the step of updating a main memory by storing therein the design changes in the respective memory units after completion of optimization by all the processors.

* * * * *